United States Patent [19]

Hashimoto

[11] Patent Number: 5,670,017

[45] Date of Patent: Sep. 23, 1997

[54] METHOD OF MANUFACTURING SEMICONDUCTOR DEVICE

[75] Inventor: Koichi Hashimoto, Kawasaki, Japan

[73] Assignee: Fujitsu Limited, Kawasaki, Japan

[21] Appl. No.: 350,841

[22] Filed: Dec. 7, 1994

[30] Foreign Application Priority Data

Dec. 28, 1993 [JP] Japan ................................. 5-336965

[51] Int. Cl.$^6$ ................................................ H01L 21/306
[52] U.S. Cl. .................. 156/643.1; 437/69; 437/235; 437/243
[58] Field of Search ..................... 156/643.1; 437/69, 437/243, 235

[56] References Cited

U.S. PATENT DOCUMENTS 5,302,240  4/1994  Hori et al. ...................... 156/643.1

OTHER PUBLICATIONS

"High NA I-Line Lithography", Nozue, Semi Technology Symposium, Dec. 2, 1992, pp. 25–30.
"X–Ray Nanolithography–the Clearest Path to 0.1 and Sub–0.1μm ULSI", Schattenburg et al, Proceedings of 1991 Intern. MicroProcess Conference, pp. 63–70.

Primary Examiner—John S. Chu
Attorney, Agent, or Firm—Nikaido, Marmelstein, Murray & Oram LLP

[57] ABSTRACT

A method of manufacturing a semiconductor device of the present invention includes steps of introducing mixed gas containing $CHF_3$ and $CF_4$ in which a gas flow ratio of $CF_4$ among $CHF_3$ and $CF_4$ is 30% or lower into an etching atmosphere, setting the pressure in the etching atmosphere to 1.2 Torr or lower and applying radio frequency electric power of 4 W/cm$^2$ or more to a pair of electrodes, thereby to apply patterning with etching to an insulating film using a resist pattern as a mask.

9 Claims, 5 Drawing Sheets

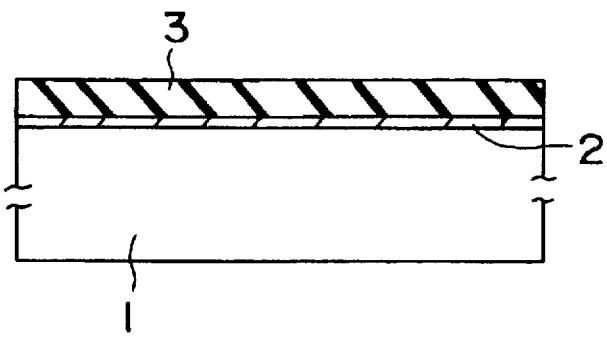
FIG.1A
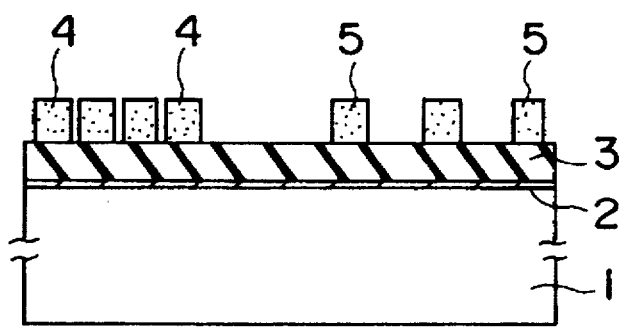
FIG.1B
FIG.1C
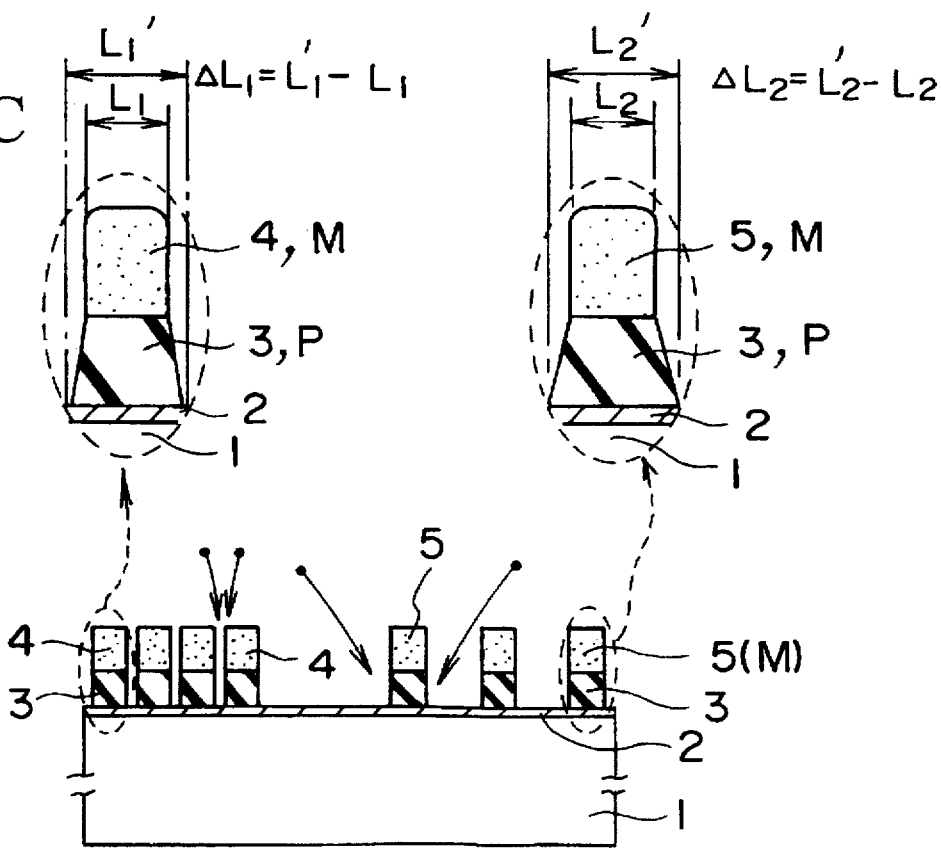
• NEUTRAL SPACIES

PATTERN WIDTH : 0.5μm
PATTERN SPACING : 0.5μm

PATTERN WIDTH : 0.5μm
PATTERN SPACING : 5.0μm

PATTERN WIDTH : 0.5μm
PATTERN SPACING : 0.5μm

Rf POWER : 500W

PATTERN WIDTH : 0.5μm
PATTERN SPACING : 5.0μm

Rf POWER : 500W

METHOD OF MANUFACTURING SEMICONDUCTOR DEVICE

BACKGROUND OF THE INVENTION

1. Field of the Invention

The present invention relates to a method of manufacturing a semiconductor device and more particularly to a method of manufacturing a semiconductor device including a patterning process of an insulating film.

2. Description of the Prior Art

With the progress of high integration of a semiconductor integrated circuit device, it becomes still more important to reduce a pattern size shift in a patterning process of manufacturing a semiconductor device thereby to improve accuracy of etching. The pattern size shift means a difference $\Delta L_1$ or $\Delta L_2$ between the dimension of an etched pattern P and the dimension of a mask M as shown in FIG. 1C.

As to etching of polycrystalline silicon and refractory metal silicide, improvement of accuracy of etching has been heretofore pursued due to the facts that these films are used for gate electrodes of MOS transistors and that the dimension of the gate electrode exerts a very potent influence upon element characteristics.

As against the above, as to etching by photolithography of an insulating film such as silicon oxide and silicon nitride, the requirement for accuracy has been comparatively loose because importance has been attached to formation of contact holes and via holes.

Accordingly, in a conventional etching technique of an insulating film, it has been pursued to form a section of a wiring material in a somewhat tapered shape (which means to enlarge the pattern size shift) and to improve selectivity for a mask or a underlying film at time of etching for the purpose of improving covering performance of the wiring material. As a result, plasma generated from mixed gas containing $CF_4$ and $CHF_3$ at a ratio of approximately 1:1 has been used as a typical etching technique of an insulating film.

However, when a pattern which is not a hole is formed among etching processes of an insulating film, it is required to make the pattern accuracy thereof better than that at time of hole pattern formation, thus requiring to reduce the pattern size shift.

As a pattern of an insulating film, a pattern of a silicon nitride film used as a mask when a silicon substrate is oxidized locally, a pattern of a silicon oxide film used as a mask when a gate electrode is formed by processing a polycrystalline silicon film and so on are well known.

However, it is required to reduce the dispersion ($\Delta L_1 - \Delta L_2$) of the pattern size shift in patterning in addition to the reduction of the pattern size shift in patterning of an insulating film. For example, there is such a problem that, when a mask pattern, for example a silicon nitride film pattern becomes uneven size at time of local oxidation, accuracy of the pattern dimension of an active region surrounded by the local oxide film is lowered, and the characteristics of transistors formed in a plurality of active regions become uneven.

In particular, in a device such as an SRAM in which high integration is desired, the dimensional accuracy of a mask composed of a silicon nitride film and the dispersion of the pattern size shift thereof becomes an issue because a nano order is also required for the dimensions of the active region.

SUMMARY OF THE INVENTION

It is an object of the present invention to provide a method of manufacturing a semiconductor device capable of reducing the dispersion of pattern size shift in the case of patterning of an insulating film.

According to the present invention, a process of patterning an insulating film by etching using the resist pattern as a mask by introducing mixed gas containing $CHF_3$ and $CF_4$ having a gas flow ratio of $CHF_3$ at 30% or lower among $CHF_3$ and $CF_4$ into the etching atmosphere, setting the pressure in the etching atmosphere to 1.2 Torr or lower, and applying radio frequency electric power at 4 W/cm$^2$ or higher to the pair of electrodes.

It has been found by experiments that the pattern size shift can be reduced irrespective of the relative size of pattern spacing of an insulating film, and moreover, the dispersion thereof reduced under such conditions described above.

This is conceivable to be caused by a fact that the pattern size shift is reduced for a relatively wide space and the difference in the pattern size shift decreases because an etching inhibitor resulting from neutral species becomes more difficult to be accumulated on a side wall of the pattern.

A pattern density dependent phenomenon by such accumulation of species on a side wall has not been known in an etching work of an insulating film. These facts that the means described above is suitable for reducing an error of the pattern size shift, and in particular, that the means has an excellent effect on the etching work of a silicon nitride film are never self-explanatory or presumable, but have been strictly found by experiments.

Besides, when the pressure of the etching atmosphere is set to 0.7 Torr or lower and the radio frequency electric power is set to 6 W/cm$^2$ or more, the pattern size shift becomes 0.025 μm or less. Further, when the gas flow ratio of $CHF_3$ was set to 20% or lower and the radio frequency electric power was set to 4 W/cm$^2$ or more, the pattern size shift became 0.05 μm or less.

Such a silicon nitride film applied with patterning with high precision is used as an oxidation-resistant mask at time of local oxidation of a silicon layer for instance.

BRIEF DESCRIPTION OF THE DRAWINGS

FIG. 1A to FIG. 1C are sectional views showing an example of a patterning process of an insulating film;

FIG. 3A and FIG. 3B are pattern size shift distribution diagrams depending on the difference in the content of $CHF_3$ and the magnitude of radio frequency electric power according to an embodiment of the present invention, wherein FIG. 3A shows the pattern size shift when the pattern spacing is at 0.5 μm and FIG. 3B shows the pattern size shift when the pattern spacing is at 5 μm;

FIG. 4A and FIG. 4B are pattern size shift distribution diagrams depending on the difference in the pressure of the etching atmosphere and the magnitude of radio frequency electric power according to an embodiment of the present invention, wherein FIG. 4A shows the pattern size shift when the pattern spacing is at 0.5 μm and FIG. 4B shows the pattern size shift when the pattern spacing is at 5 μm; and FIG. 5A and FIG. 5B are pattern size shift distribution diagrams depending on the difference in the pressure of the etching atmosphere and the content of $CHF_3$ according to an embodiment of the present invention, wherein FIG. 5A shows the pattern size shift when the pattern spacing is at 0.5 μm and FIG. 5B shows the pattern size shift when the pattern spacing is at 5 μm.

DESCRIPTION OF THE PREFERRED EMBODIMENTS

Figure 2:
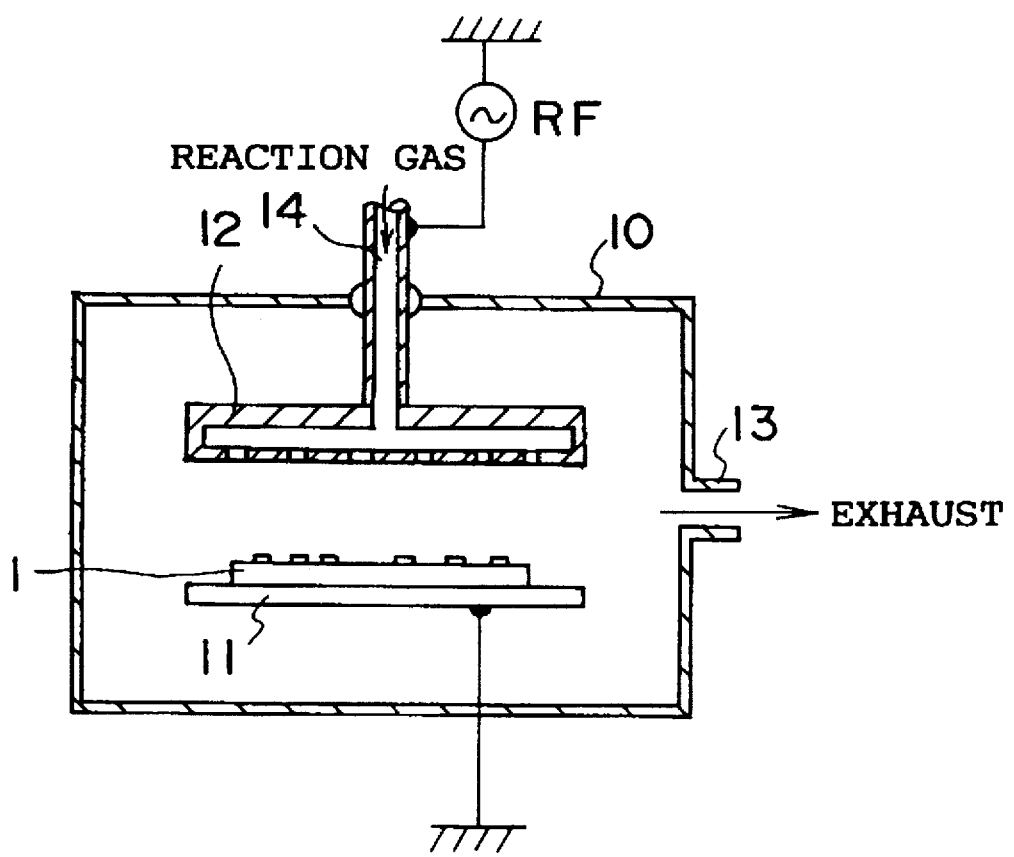
FIG. 2 is a structural diagram showing an example of a plasma etching apparatus used for etching according to the present invention.

The dispersion of the pattern size shift of a pattern of an insulating film will be described.

Since the pattern size shift of a pattern of an insulating film applied with patterning by a photolithography method increases with the insulating film thickness, it seems sufficient to make the insulating film thinner in order to reduce the pattern size shift. However, an optimum value exists for the film thickness.

For example, it has been clarified by experiments by the present inventor et al. that the area of a bird's beak produced at the edge of the locally oxidized film undesirably increases with a decrease in the thickness of a silicon nitride film used as an oxidation-resistant mask for Local oxidation of a silicon substrate, and that an optimum value exists for the thickness when an increase of crystal defect generation in the silicon substrate and an increase of the pattern size shift with the silicon nitride film thickness are taken into consideration.

Further, when a gate electrode of a MOS transistor is formed by applying patterning to a conductive film with a silicon oxide film as a mask, an optimum value also exists for the film thickness of the silicon oxide film, and it is insufficient only to make the silicon oxide film thinner.

It has been clarified by experiments that, when a region of high pattern density and a region of low pattern density are compared with each other, a difference in the pattern size shift is produced in these regions in patterning of the insulating film.

Accordingly, patterning conditions for reducing the dependency on the thickness of the insulating film and the dependency on the pattern density become required.

Now, a method of investigating the difference of the pattern size shift produced in a patterning process and making the difference as small as possible will be described hereunder.

First, the contents of experiments by which the subjects have been found and the results thereof are explained.

As shown in FIG. 1A, a silicon oxide film 2 having a thickness of 5 nm is formed by oxidizing a surface of a silicon substrate 1 thermally, and a silicon nitride film 3 having a thickness of 120 nm is formed thereon thereafter by a low pressure CVD method.

Next, as shown in FIG. 1B, photoresist is applied onto the silicon nitride film 3 and exposed and developed, and a plurality lines of line resist patterns 4 each having a width of 0.5 µm are formed with spaces of 0.5 µm in a first region where the pattern density is high, and on the other hand, a plurality lines of line resist patterns 5 each having a width of 0.5 µm are formed at spaces of 5.0 µm in a second region where the pattern density is low.

Thereafter, the silicon substrate 1 is placed on an electrode 11 on the ground side among a pair of electrodes 11 and 12 located in a chamber 10 of a plasma etching apparatus such as shown in FIG. 2. These electrodes 11 and 12 are arranged at a narrow gap of 9 mm.

After the silicon substrate 1 is installed on the electrode 11 through a load lock not illustrated, $CF_4$ gas, $CHF_3$ gas and Ar gas are introduced at flow rates of 35 sccm, 35 sccm and 500 sccm, respectively, into the chamber 10 through a gas inlet port 14. At this time, the pumping speed from an exhaust port 13 is adjusted so that the pressure reaches 1.8 Torr. Further, electric power from a radio frequency power source Rf of 4.5 W/cm² is applied to the pair of electrodes 11 and 12. The silicon nitride film 3 in the regions that are not covered with the resist patterns 4 and 5 is etched under such conditions as shown in FIG. 1C.

In the pattern of the silicon nitride film 3 thus obtained, a pattern size shift $\Delta L_1$ of 0.05 µm was generated under the resist patterns 4 with spaces of 0.5 µm, and a pattern size shift $\Delta L_2$ of 0.15 µm was generated under the resist patterns 5 with spaces of 5.0 µm.

When the surface of the silicon substrate 1 is oxidized locally, the surface of the silicon substrate 1 is oxidized thermally using the silicon nitride film 3 as an oxidation-resistant mask after the resists 4 and 5 on the silicon nitride film 3 are removed.

With the foregoing, it has been found that dispersion is produced in the pattern size shift depending on the difference in pattern spaces.

Namely, the difference of the pattern size shift ($\Delta L_1 - \Delta L_2$) in a first region and a second region was 0.1 µm. This difference shows a value that is by no means negligible when a plurality of patterns each having a width of 0.5 µm or less are going to be formed by making the spaces different from one another.

Next, a tolerance of the difference of the pattern size shift depending on the pattern is described.

There is a possibility that a silicon nitride film having a film thickness of 120 nm is applied with patterning with spaces of 0.25 µm at a minimum by photolithography for local oxidation, and it is conceivable that the difference of the pattern size shift due to the difference in pattern spaces can be disregarded if the dispersion of the pattern size shift in that case can be controlled within 0.025 µm that is 10% of 0.25 µm.

Here, the reason why "10% or less of the minimum pattern width" is specified is that this is a value required as an allowable value of general pattern dimensional accuracy. The allowable value is described in numerous documents such as those given hereunder and others, but no allowable value of dispersion of the pattern size shift has been reported. In a case of the SRAM, it is desirable to suppress an error in a width an active region within the above order, that is 10% or less.

(1) S. Wittekoek, P. Jenkins: SEMI Technology Symposium 93, Transactions pp. 170–180

(2) Hiroshi Nozue: SEMI Technology Symposium 92, Transactions pp. 25–33

(3) M. L. Schattenburg and H. I. Smith: Proc. 1991 Int. MicroProcess Conf. pp. 63–70

When experiments were performed with the flow ratio of $CHF_3$ to $CF_4$, pressure and flow ratio frequency electric power as parameters for patterning of the silicon nitride film described above, the results shown in FIG. 3A, FIG. 3B, FIG. 4A, FIG. 4B, FIG. 5A and FIG. 5B were obtained. The numerals shown at the intersections of the broken lines in FIG. 3A, FIG. 4A and FIG. 5A indicate the pattern size shifts when the pattern space is at 0.5 µm, and the numerals in FIG. 3B, FIG. 4B and FIG. 5B indicate the pattern size shifts when the pattern space is at 5 µm.

Here, the pattern width is prescribed to be 0.5 µm. In this case, the difference of the pattern size shift no more than 10% of the pattern width of 0.5 µm, i.e., no more than 0.05 µm is required.

Figure 3A:
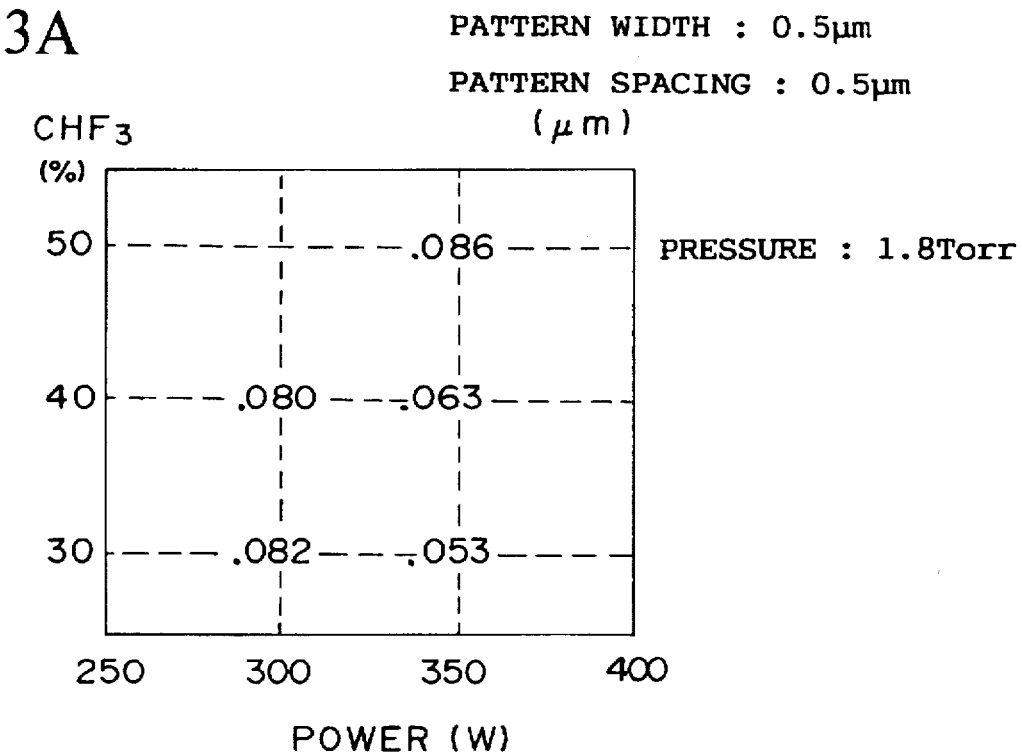
Figure 3B:
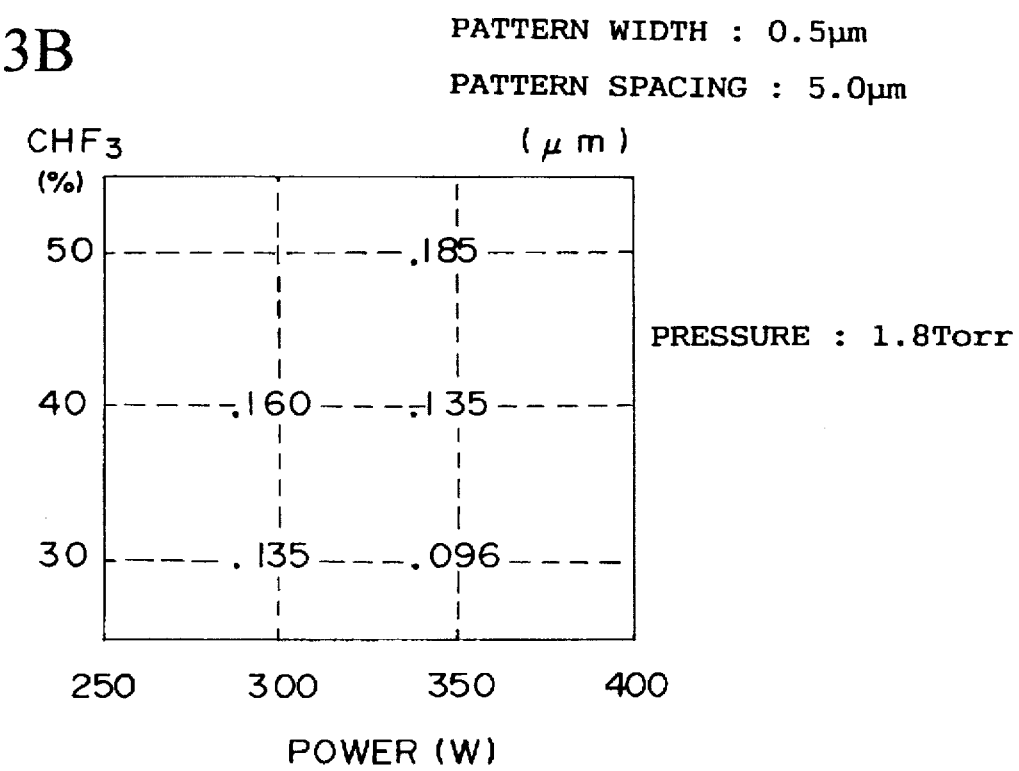

FIG. 3A and FIG. 3B show the relationship among the magnitude of radio frequency electric power (the axis of abscissas), the content of $CHF_3$ (the axis of ordinates) and the pattern size shift while maintaining the pressure of the etching atmosphere constant at 1.8 Torr. The content of $CHF_3$ shows the ratio of $CHF_3$ to the sum of $CF_4$ and $CHF_3$ introduced in the chamber.

As a result, the difference of the pattern size shift ($\Delta L_1 - \Delta L_2$) became 0.043 μm only when the radio frequency electric power was set to as high as 350 W (approximately 4 W/cm$^2$) and the content of $CHF_3$ was set to as low as 30%. With this, it is realized that the difference of the pattern size shift can be controlled to approximately 0.05 μm or less by controlling the content of $CHF_3$ to 30% or lower.

Figure 4A:
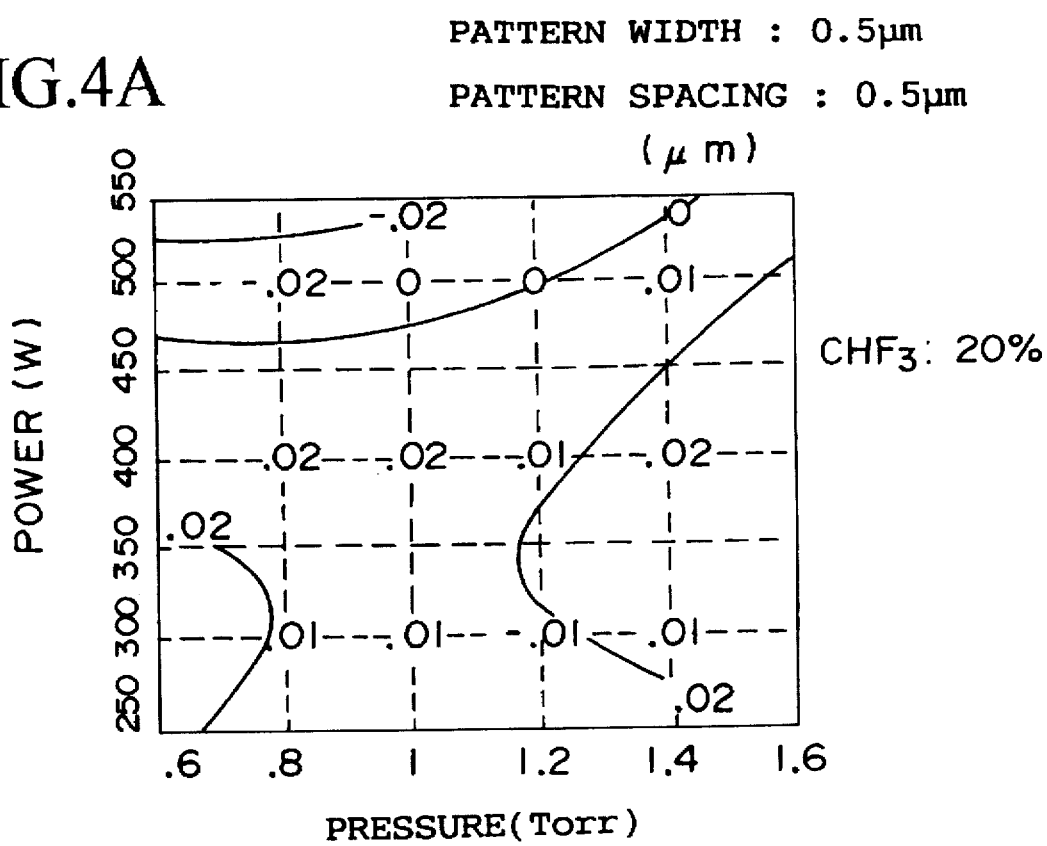
Figure 4B:
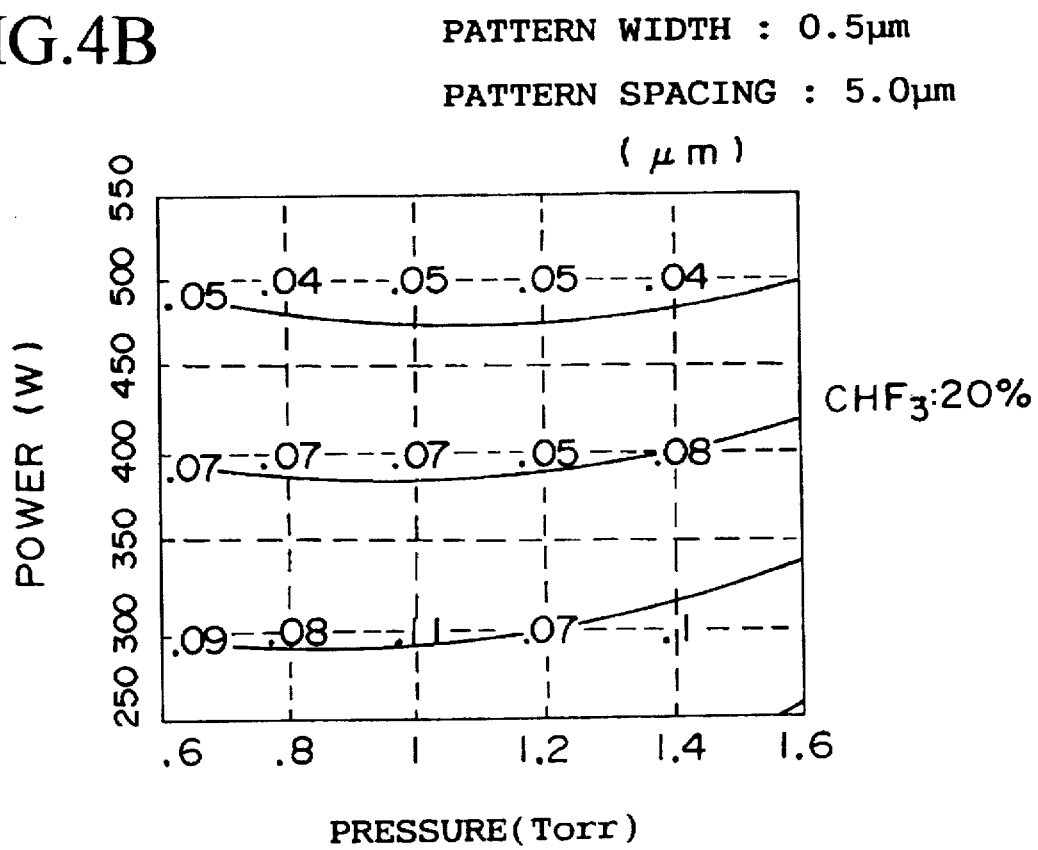

When the relationship among the pattern size shift, the output of radio frequency electric power and the pressure of etching atmosphere was investigated while maintaining the content of $CHF_3$ at 20%, the results shown in FIG. 4A and FIG. 4B were obtained. The curves in FIG. 4A and FIG. 4B show contour lines of the pattern size shifts.

The pattern size shift at 0.05 μm or less is obtained from these results under the conditions within a regime where the output of radio frequency electric power (the axis of ordinates) is 400 W or more and the pressure of etching atmosphere (the axis of abscissas) is 1.2 Torr or lower, and the allowable conditions that the difference of the pattern size shift is 10% or less of the pattern width of 0.5 μm are satisfied in that regime.

Figure 5A:
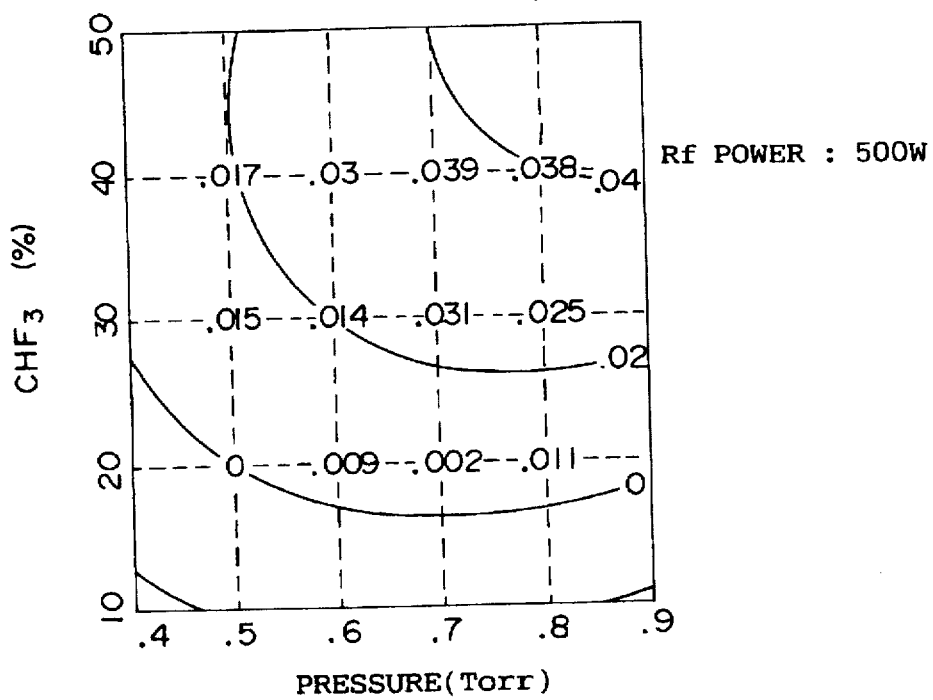
Figure 5B:
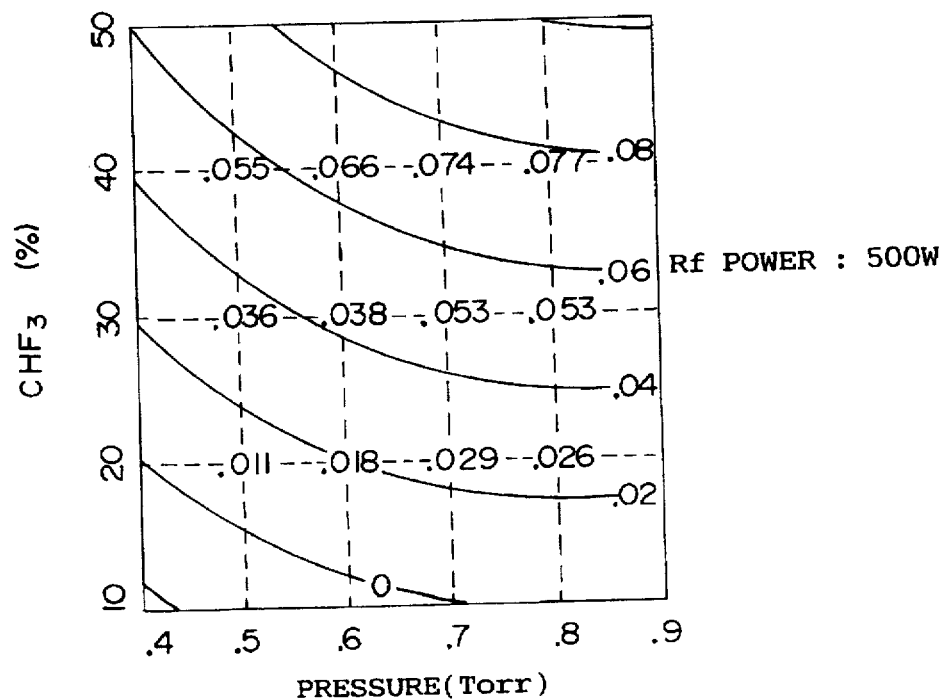

When the output of radio frequency electric power was held at 500 W and the relationship between the content of $CHF_3$ and the pressure of etching atmosphere was examined by experiments based on these results, such values as shown in FIG. 5A and FIG. 5B were obtained within the regime that $CHF_3$ is 40% or less and the pressure is 0.9 Torr or lower. The curves in FIG. 5A and FIG. 5B show contour lines of the pattern size shifts.

The conditions for reducing the difference of the pattern size shift further are obtainable from these results.

What has been clarified from three experiments described above is that the dependency on pattern spaces of the pattern size shift decreases smaller as the content of $CHF_3$ is reduced, as the pressure of the etching atmosphere is reduced and as the magnitude of the radio frequency electric power is increased.

When these parameters are changed more largely than the above-mentioned regime, however, a poor etching selectivity to the silicon substrate 1 or a poor discharge stability is produced. Taking such a fact into consideration, $CF_4$ at 64 sccm, $CHF_3$ at 16 sccm, argon gas at 500 sccm, the pressure in the chamber at 0.5 Torr and the radio frequency electric power at 6 W/cm$^2$ (500 W) are attained as the optimum etching conditions in the embodiment. In this case, the gas flow ratio of $CHF_3$ in the mixed gas of $CF_4$ and $CHF_3$ is 20%.

Further, when the allowable value is set to 10% or less of the pattern width of 0.5 μm, conditions for setting the gas flow ratio of $CHF_3$ gas in the mixed gas of $CF_4$ and $CHF_3$ to 20% or lower, the pressure of the etching atmosphere to 1.2 Torr or lower, and the radio frequency electric power to 5 W/cm$^2$ or more are attained in a regime that has been known experimentally. When the allowable value is set strictly to 10% or less of the pattern width of 0.25 μm, such conditions for setting the $CHF_3$ gas flow ratio in the mixed gas of $CF_4$ and $CHF_3$ to 30% or below, the pressure in the chamber to 0.7 Torr or lower and the radio frequency electric power to 6 W/cm$^2$ or more are attained.

Further, when a pattern of a silicon nitride film 0.25 μm wide at the minimum is used as a mask of local oxidation of silicon (LOCOS), it is conceivable that the pattern size shift is allowable up to approximately 0.05 μm that is 20% of the pattern width. Hence, the regime capable of selecting the conditions is extended.

The following is conceivable as the reason why the difference of the pattern size shift produced under a certain condition is controlled as described above.

First, in FIG. 1C, since neutral species such as hydrogen compounds impinging obliquely at time of patterning are liable to attach to the side walls of the pattern of the silicon nitride film 3 in a second region where the pattern space is wide, and this attachment acts as an etching mask, wide taper etching is generated. As against the above, adjacent patterns prevent the neutral species impinging obliquely from attaching to the side walls in a first region where the pattern space is small, thus making taper etching more difficult to be produced. These seems to produce the difference ($\Delta L_1 - \Delta L_2$) in the pattern size shift at time of patterning.

Thus, it is conceivable that setting the paramerters described above at the above-mentioned conditions reduces attaching neutral species existing in the atmosphere around the substrate, and moreover, provides the etchant with sufficient energy to penetrate through the attachment on the side wall of the pattern, so that the pattern size shift caused by taper etching reduces and the difference of the pattern size shift also reduces.

As to the pattern size shift, it has been found that, for instance, when patterns having spaces of 0.5 μm, 1.5 μm and 5.0 μm are formed by partitioning the region with a resist pattern as a mask, the difference of the pattern size shift between the pattern of 0.5 μm and the pattern of 1.5 μm is larger particularly as compared with the difference between the pattern of 1.5 μm and the pattern of 5 μm. This is conceivably due to such a fact that attachment of the neutral species to the side wall is remarkably less in the case of the pattern space of 0.5 μm as compared with the case of the pattern space of 1.5 μm or 5.0 μm.

Although the regime of etching conditions described above has been found by experiments, the subject of the pattern size shift and the method itself of coping therewith fall within the regime of the present invention, and it is a matter of course that analogical inference can also be made with respect to a region that is not covered by the experiments from parameter dependency that has been already known. Further, it has also been described that the regime of etching conditions changes in accordance with the allowable value.

Further, a silicon nitride film has been adopted as an object of patterning in the above description, but, there is also dispersion of the pattern size shift in the case of patterning of a silicon oxide film, it is possible to reduce the dispersion, and moreover, to reduce the pattern dimension difference by adopting the method of the present invention.

As described above, according to the present invention, respective relationships among the mixing ratio of reaction gas, the magnitude of radio frequency electric power, the pressure of the etching atmosphere and the difference of the pattern size shift are shown with graphs by experiments, and the optimum regime of the conditions is obtained. Thus, the pattern of the LOCOS made with an insulating film as a mask and the pattern of a conductive film applied with patterning with the insulating film as the mask are controlled with high precision.

What is claimed is:

1. A method of manufacturing a semiconductor device comprising the steps of:

providing a semiconductor substrate having an insulating film disposed thereupon;

forming resist patterns on the insulating film;

placing said insulating film between a pair of electrodes in an etching atmosphere; and introducing mixed gas containing $CHF_3$ and $CF_4$ in which a gas flow ratio of $CHF_3$ is 30% or below among $CHF_3$ and $CF_4$ into said etching atmosphere, setting the pressure in said etching atmosphere to 1.2 Torr or lower, and applying radio frequency electric power at 4 $W/cm^2$ or more to said pair of electrodes, thereby to apply patterning to said insulating film by etching using said resist patterns as a mask.

2. The method of manufacturing a semiconductor device according to claim 1, wherein said insulating film is either a silicon nitride film or a silicon oxide film.

3. The method of manufacturing a semiconductor device according to claim 1, wherein said insulating film is a silicon nitride film, and said insulating film is etched selectively with a gas flow ratio of $CHF_3$ among $CHF_3$ and $CF_4$ set to 20% or lower and radio frequency electric power to 4 $W/cm^2$ or more.

4. The method of manufacturing a semiconductor device according to claim 3, wherein a silicon layer exists under said silicon nitride film, and said silicon nitride film applied with patterning is used as an oxidation-resistant mask for oxidizing said silicon layer locally.

5. The method of manufacturing a semiconductor device according to claim 1, wherein said insulating film is a silicon nitride film, and said insulating film is etched selectively with said pressure set to 0.7 Torr or lower and radio frequency electric power set to 6 $W/cm^2$ or more.

6. The method of manufacturing a semiconductor device according to claim 5, wherein a silicon layer exists under said silicon nitride film, and said silicon nitride film applied with patterning is used as an oxidation-resistant mask for oxidizing said silicon layer locally.

7. The method of manufacturing a semiconductor device comprising the steps of:

providing a semiconductor substrate having an insulating film thereupon;

forming a plurality of first resist patterns formed in a first region and a plurality of second resist patterns formed in a second region on said insulating film, said second region having a pattern density lower than that in said first region;

applying patterning to said insulating film by etching said insulating film using said first resist patterns and said second resist patterns as a mask while preventing neutral species from attaching to said walls; thereby controlling the difference between a pattern size shift of the pattern of said insulating film existing under said first resist patterns and a pattern size shift of the pattern of said insulating film existing under said second resist patterns within 10% of the minimum pattern width.

8. The method of manufacturing a semiconductor device according to claim 7, wherein said insulating film is either a silicon nitride film or a silicon oxide film.

9. The method of manufacturing a semiconductor device according to claim 7, wherein a silicon layer exists under said insulating film, said insulating film is a silicon nitride film, and the pattern of said silicon nitride film is used as an oxidation-resistant mask when said silicon layer is oxidized locally.

* * * * *